United States Patent
Wang et al.

(10) Patent No.: US 9,754,970 B2
(45) Date of Patent: Sep. 5, 2017

(54) THIN FILM TRANSISTOR, FABRICATING METHOD THEREOF, ARRAY SUBSTRATE AND DISPLAY DEVICE

(71) Applicant: BOE TECHNOLOGY GROUP CO., LTD., Beijing (CN)

(72) Inventors: Dongfang Wang, Beijing (CN); Jiangbo Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/435,772

(22) PCT Filed: Sep. 17, 2014

(86) PCT No.: PCT/CN2014/086701
§ 371 (c)(1),
(2) Date: Apr. 15, 2016

(87) PCT Pub. No.: WO2015/161619
PCT Pub. Date: Oct. 29, 2015

(65) Prior Publication Data
US 2016/0336349 A1   Nov. 17, 2016

(30) Foreign Application Priority Data
Apr. 22, 2014 (CN) .......................... 2014 1 0162697

(51) Int. Cl.
*H01L 21/20* (2006.01)
*H01L 27/12* (2006.01)
(Continued)

(52) U.S. Cl.
CPC .... *H01L 27/1214* (2013.01); *H01L 21/02488* (2013.01); *H01L 21/02491* (2013.01);
(Continued)

(58) Field of Classification Search
CPC .......... H01L 2021/775; H01L 27/1214; H01L 27/1251–27/1288; H01L 29/4908;
(Continued)

(56) References Cited

U.S. PATENT DOCUMENTS

2010/0320467 A1   12/2010   Ukeda et al.
2011/0049511 A1*   3/2011   Yano .................. H01L 29/7869
                                                        257/43
(Continued)

FOREIGN PATENT DOCUMENTS

CN           1431711 A       7/2003
CN           1761074 A       4/2006
(Continued)

OTHER PUBLICATIONS

Office Action dated Jan. 29, 2015 issued in corresponding Chinese Application No. 201410162697.2.
(Continued)

*Primary Examiner* — Cuong B Nguyen
(74) *Attorney, Agent, or Firm* — Nath, Goldberg & Meyer; Joshua B. Goldberg

(57) ABSTRACT

The present invention provides a thin film transistor, a fabricating method thereof, an array substrate and a display device. The fabricating method of the thin film transistor of the present invention comprises: forming an inducing layer film and an oxide active layer film in contact therewith on a substrate, the oxide active layer film being provided above or below the inducing layer film; and heating the substrate subjected to the above step, crystallizing the oxide active layer film through inducement of the inducing layer film to form a crystalline oxide active layer.

18 Claims, 2 Drawing Sheets

(51) Int. Cl.
  *H01L 29/786* (2006.01)
  *H01L 29/04* (2006.01)
  *H01L 21/02* (2006.01)
(52) U.S. Cl.
  CPC .. *H01L 21/02502* (2013.01); *H01L 21/02554* (2013.01); *H01L 21/02565* (2013.01); *H01L 21/02672* (2013.01); *H01L 29/045* (2013.01); *H01L 29/786* (2013.01); *H01L 29/7869* (2013.01)
(58) Field of Classification Search
  CPC .. H01L 2924/13069; H01L 27/3244–27/3297; H01L 51/0508–51/0533
  See application file for complete search history.

(56) References Cited

U.S. PATENT DOCUMENTS

2011/0050733 A1    3/2011  Yano et al.
2011/0121309 A1*   5/2011  Lee .................. H01L 21/02488
                                                      257/72
2011/0240987 A1   10/2011  Lee et al.
2014/0118232 A1*   5/2014  Kim ...................... H01L 27/124
                                                      345/82

FOREIGN PATENT DOCUMENTS

| | | |
|---|---|---|
| CN | 101252150 A | 8/2008 |
| CN | 102751200 A | 10/2012 |
| CN | 103700665 A | 4/2014 |
| CN | 103972110 A | 8/2014 |

OTHER PUBLICATIONS

Office Action dated Apr. 10, 2015 issued in corresponding Chinese Application No. 201410162697.2.
Written Opinion of the International Searching Authority dated Jan. 21, 2015 in corresponding International Application No. PCT/CN2014/086701.

* cited by examiner

THIN FILM TRANSISTOR, FABRICATING METHOD THEREOF, ARRAY SUBSTRATE AND DISPLAY DEVICE

This is a National Phase Application filed under 35 U.S.C. 371 as a national stage of PCT/CN2014/086701, filed Sep. 17, 2014, an application claiming the benefit of Chinese Application No. 201410162697.2, filed Apr. 22, 2014, the content of each of which is hereby incorporated by reference in its entirety.

FIELD OF THE INVENTION

The present invention relates to the technical field of manufacturing of display device, and particularly relates to a thin film transistor, a fabricating method thereof, an array substrate and a display device.

BACKGROUND OF THE INVENTION

With continuous development of display technology, oxide thin film transistors have been increasingly used widely due to the characteristics of high electron mobility, low fabricating temperature, good uniformity, transparency to visible light, low threshold voltage and the like.

In manufacturing of an oxide thin film transistor in the prior art, since an oxide active layer of the oxide thin film transistor is made of metal oxide, it is poor in stability, and prone to influence by oxygen, hydrogen and water in etching environment. Thus, in order to prevent the oxide active layer from being affected in etching of a source and a drain of the oxide thin film transistor, an etch stop layer (ESL) is added for protecting the oxide active layer.

The inventor found at least the following problems in the prior art. Since the etch stop layer is added, that is, a step of fabricating process of the oxide thin film transistor is added, if fabrication of the etch stop layer is not controlled properly in this case, for example, if the thickness of the etch stop layer fabricated is non-uniform, properties of the oxide thin film transistor may be affected. Thus, not only the manufacturing process of the oxide thin film transistor becomes complicated and the manufacturing cost is increased, but also the production capacity and yield of the array substrate manufactured are reduced. To solve the problem that the oxide thin film transistor in the prior art needs to be provided with the etch stop layer, a crystalline oxide active layer is generally adopted as the oxide active layer of the oxide thin film transistor, but the crystallizing temperature is very high and is very likely to affect other film layers, and thus lowing the crystallizing temperature of the oxide active layer is highly anticipated for applications of the oxide thin film transistor.

SUMMARY OF THE INVENTION

Technical problems to be solved by the present invention include providing a thin film transistor during fabricating of which a crystallizing temperature of an oxide active layer is lowered, a fabricating method thereof, an array substrate and a display device, in view of the above-mentioned problems in existing fabricating of the thin film transistor.

The present invention provides a fabricating method of a thin film transistor, comprising the following steps of: forming an inducing layer film and an oxide active layer film in contact therewith on a substrate, the oxide active layer film being provided above or below the inducing layer film; and heating the substrate subjected to the above step, and crystallizing the oxide active layer film through inducement of the inducing layer film to form a crystalline oxide active layer.

The crystalline oxide active layer formed in the fabricating method of the thin film transistor of the embodiments of the present invention is formed through inducement of the inducing layer film, and in this case the oxide active layer (film) can be crystallized without needing a high temperature, so that the fabricating process is easier to be implemented.

In the fabricating method, the step of forming an inducing layer film and an oxide active layer film in contact therewith on a substrate may include: forming the inducing layer film and the oxide active layer film successively on the substrate.

Before forming the inducing layer film and the oxide active layer film successively on the substrate, the fabricating method further comprises: forming a pattern including a gate by a patterning process on the substrate.

The step of crystallizing the oxide active layer film through inducement of the inducing layer film to form a crystalline oxide active layer may include: heating the substrate on which successively formed with the inducing layer film and the oxide active layer film are successively formed, such that the oxide active layer film is crystallized through inducement of the inducing layer film to form a crystalline oxide active layer film, and the inducing layer film is changed to an oxide inducing layer; and forming a pattern including the crystalline oxide active layer by a patterning process on the substrate subjected to the above step.

The step of crystallizing the oxide active layer film through inducement of the inducing layer film to form a crystalline oxide active layer may include: forming a patterned oxide active layer film by a patterning process on the substrate on which the inducing layer film and the oxide active layer film are successively formed; and heating the substrate subjected to the above step, such that the patterned oxide active layer film is crystallized through inducement of the inducing layer film to form a crystalline oxide active layer, and the inducing layer film is changed to an oxide inducing layer.

In the fabricating method, the step of forming an inducing layer film and an oxide active layer film in contact therewith on a substrate may include: forming the oxide active layer film and the inducing layer film successively on the substrate.

The step of crystallizing the oxide active layer film through inducement of the inducing layer film to form a crystalline oxide active layer may include: heating the substrate successively formed with the oxide active layer film and the inducing layer film, such that the oxide active layer film is crystallized through inducement of the inducing layer film to form a crystalline oxide active layer film, and the inducing layer film is changed to an oxide inducing layer film; and forming a pattern including the crystalline oxide active layer and the oxide inducing layer by a patterning process on the substrate subjected to the above step.

After forming the crystalline oxide active layer and the oxide inducing layer, the method further comprises: forming a pattern including a gate by a patterning process.

The inducing layer film may be made of metal having a hexagonal lattice structure or hexagonal lattice derived structure, and the step of forming the crystalline oxide active layer includes: putting the substrate formed with the inducing layer film and the oxide active layer film in an atmosphere of oxygen-containing gas and heating the substrate, such that the oxide active layer film is changed to the crystalline oxide active layer film under action of the inducing layer film.

The metal having a hexagonal lattice structure or hexagonal lattice derived structure is any one of aluminum, magnesium and titanium.

In the step of forming the crystalline oxide active layer, the heating temperature (crystallizing temperature) is within the range of 450° C.-700° C., and the oxygen content of the oxygen-containing gas is 5%~40%.

The inducing layer film may be made of insulating non-metal having a hexagonal lattice structure or hexagonal lattice derived structure.

The insulating non-metal having a hexagonal lattice structure or hexagonal lattice derived structure is any one of aluminum oxide, magnesium oxide, gadolinium oxide, zirconium oxide and titanium oxide.

An embodiment of the present invention provides a fabricating method of a thin film transistor, comprising steps of: forming an inducing layer film and an oxide active layer film in contact therewith on a substrate, the oxide active layer film being provided above or below the inducing layer film, and forming a patterned inducing layer film and a patterned oxide active layer film by a patterning process; and heating the substrate subjected to the above step, crystallizing the patterned oxide active layer film through inducement of the patterned inducing layer to form a crystalline oxide active layer.

In the fabricating method, the step of forming a patterned inducing layer film and a patterned oxide active layer film may include: forming the inducing layer film and the oxide active layer film successively on the substrate; and forming the patterned inducing layer film and the patterned oxide active layer film by a single patterning process on the substrate subjected to the above step.

Before forming the inducing layer film on the substrate, the fabricating method further comprises: forming a pattern including a gate by a patterning process on the substrate.

In the fabricating method, the step of forming a patterned inducing layer film and a patterned oxide active layer film may include: forming the oxide active layer film and the inducing layer film successively on the substrate; and forming the patterned inducing layer film and the patterned oxide active layer film by a single patterning process on the substrate subjected to the above step.

After forming the crystalline oxide active layer, the fabricating method further includes: forming a pattern including a gate by a patterning process.

The inducing layer film may be made of metal having a hexagonal lattice structure or hexagonal lattice derived structure, and the step of forming the crystalline oxide active layer includes: putting the substrate formed with the patterned inducing layer film and the patterned oxide active layer film in an atmosphere of oxygen-containing gas and heating the substrate, such that the patterned oxide active layer film is changed to the crystalline oxide active layer under action of the patterned inducing layer film, and the patterned inducing layer film is changed to an oxide inducing layer.

The metal having a hexagonal lattice structure or hexagonal lattice derived structure is any one of aluminum, magnesium and titanium.

In the step of forming the crystalline oxide active layer, the heating temperature is within the range of 450° C.-700° C., and the oxygen content of the oxygen-containing gas is 5%~40%.

The inducing layer film may be made of insulating non-metal having a hexagonal lattice structure or hexagonal lattice derived structure.

The insulating non-metal having a hexagonal lattice structure or hexagonal lattice derived structure is any one of aluminum oxide, magnesium oxide, gadolinium oxide, zirconium oxide and titanium oxide.

The present invention also provides a thin film transistor fabricated by using the above fabricating method.

The present invention also provides an array substrate comprising the above thin film transistor.

The present invention also provides a display device comprising the above array substrate.

DETAILED DESCRIPTION OF THE EMBODIMENTS

To make the person skilled in the art better understand the technical solution of the present invention, the present invention is further described below in detail in conjunction with the accompanying drawings and the specific implementations.

First Embodiment

As shown in FIGS. 1A through 1E, this embodiment provides a fabricating method of a thin film transistor which may be a top-gate thin film transistor or a bottom-gate thin film transistor. The person skilled in the art may understand that a main difference between a top-gate thin film transistor and a bottom-gate thin film transistor is that a gate 2 of the top-gate thin film transistor is disposed above an active layer (crystalline oxide active layer 5), while a gate 2 of the bottom-gate thin film transistor is disposed below an active layer (crystalline oxide active layer 5), and there is no notable difference in other layers of the thin film transistors. The method below is described by taking a fabricating method of a bottom-gate thin film transistor as an example. The method specifically comprises the following steps 1 through 5.

Figure 1A:
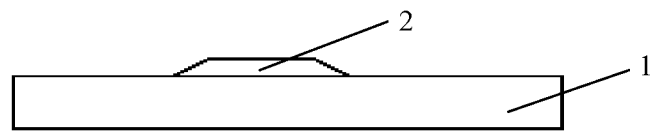
FIGS. 1A through 1E are flow charts of a fabricating method of a thin film transistor of a first embodiment of the present invention.

Step 1: depositing a gate metal layer film on a substrate 1 by using a magnetron sputtering method, and forming a pattern of a metal layer including a gate 2 of the thin film transistor and a gate line (not illustrated) by a patterning process, as shown in FIG. 1A.

It needs to be noted that the substrate 1 may be a substrate without any film layer formed thereon, such as white glass, and may also be a substrate formed with other film layer or patterns, such as a substrate formed with a buffer layer. The patterning process generally includes photoresist coating, exposure, development, etching, photoresist stripping and the like. The above step includes: firstly forming a gate metal layer film, and applying a photoresist to cover the gate metal layer film; exposing by using a mask plate to form an exposure area and a non-exposure area; developing to remove the photoresist in the exposure area (taking a positive photoresist as an example) while retaining the photoresist in the non-exposure area; etching the gate metal layer film, the gate metal layer film in the non-exposure area being not etched due to protection by the photoresist; and finally stripping off the photoresist to form a pattern of a gate metal layer including a gate 2 of the thin film transistor and a gate line.

The gate metal layer film may be a monolayer or multilayer composite laminated layer formed by one or more of molybdenum (Mo), molybdenum niobium alloy (MoNb), aluminum (Al), aluminum neodymium alloy (AlNd), titanium (Ti) and copper (Cu), such as a monolayer or multilayer composite film formed by Mo, Al or an alloy containing Mo and Al.

Figure 1B:
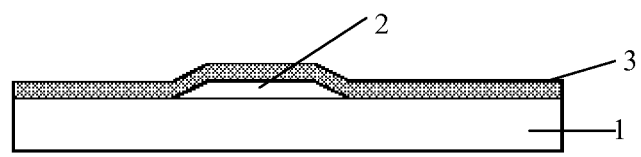
Figure 1C:
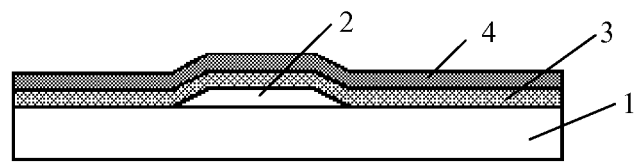

Step 2: successively forming an inducing layer film 3 and an oxide active layer film 4 provided above the inducing layer film 3 and in contact therewith, on the substrate 1 subjected to the above step, by thermal growth, atmospheric pressure chemical vapor deposition, low pressure chemical vapor deposition, plasma assisted chemical vapor deposition, sputtering or other fabricating method, as shown in FIGS. 1B and 1C.

The inducing layer film 3 may be made of metal material having a hexagonal lattice structure or hexagonal lattice derived structure, the metal being, for example, aluminum, magnesium, titanium or other metal that can be oxidized to have excellent insulating property. In addition, the inducing layer film 3 may also be made of non-metal material having a hexagonal lattice structure or hexagonal lattice derived structure, the non-metal material being, for example, aluminum oxide, magnesium oxide, gadolinium oxide, zirconium oxide, titanium oxide or the like.

The oxide active layer film 4 may be a film, containing In (indium), Ga (gallium), Zn (zinc), O (oxygen), Sn (tin) or other element, formed by sputtering, and the film must contain oxygen element and other two or more elements, for example, the oxide active layer film 4 may contain any one material of indium gallium zinc oxide (IGZO), indium zinc oxide (IZO), indium tin oxide (InSnO), indium gallium tin oxide (InGaSnO) and the like. In this embodiment, the oxide semiconductor active layer may be made of, for example, IGZO and IZO, with a thickness controlled within a range from 10 nm to 100 nm.

Step 3: heating the substrate 1 subjected to the above step, crystallizing the oxide active layer film 4 through inducement of the inducing layer film 3 to form a crystalline oxide active layer film.

In the case where the inducing layer film 3 is made of metal having a hexagonal lattice structure or hexagonal lattice derived structure, taking an example of using metal aluminum as material of the inducing layer film 3 and using IGZO for the oxide active layer film 4, the step of forming the crystalline oxide active layer film specifically includes: putting the substrate 1 formed with the metal Al inducing layer film 3 and the IGZO oxide active layer film 4 in an atmosphere of oxygen-containing gas and heating the same at a temperature within the range of 450° C. to 700° C. for a time period of 10 minutes to 2 hours selected according to different temperatures, the oxygen content of the oxygen-containing gas being 5%~40%, such that the IGZO oxide active layer film 4 becomes a crystalline IGZO oxide active layer film under action of the metal Al inducing layer film 3, and at the same time the metal Al inducing layer film 3 becomes a compact $Al_2O_3$ oxide inducing layer 7. Since $Al_2O_3$ is an insulating layer substance, the oxide inducing layer also acts as a gate insulating layer.

If the inducing layer film 3 is made of non-metal having a hexagonal lattice structure or hexagonal lattice derived structure, then the non-metal inducing layer film 3 and the oxide active layer film 4 may be heated directly, to crystallize the oxide active layer film 4 into a crystalline oxide active layer film. In this case, the non-metal oxide inducing layer 7 is also an insulating layer, and may also act as a gate insulating layer.

Figure 1D:
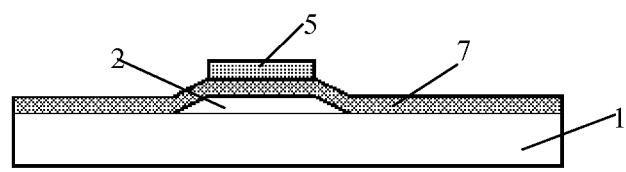

Step 4: forming a pattern including the crystalline oxide active layer 5 by a patterning process on the substrate 1 subjected to the above step, as shown in FIG. 1D.

Figure 1E:
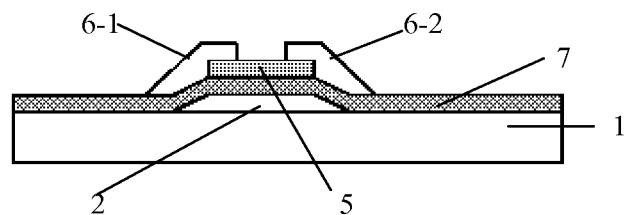

Step 5: forming a source-drain metal layer film on the substrate 1 subjected to the above step, and forming a pattern including a source 6-1 and a drain 6-2 of the thin film transistor by a patterning process, the source 6-1 and the drain 6-2 contacting the crystalline oxide active layer 5 via source and drain contact regions respectively, as shown in FIG. 1E.

The source-drain metal layer film may be formed by one or more materials of molybdenum (Mo), molybdenum niobium alloy (MoNb), aluminum (Al), aluminum neodymium alloy (AlNd), titanium (Ti) and copper (Cu), for example, being formed by Mo, Al or an alloy containing Mo and Al.

In this embodiment, the crystalline oxide active layer 5 is formed through inducement of the inducing layer film 3, and in this case the oxide active layer (film) 4 can be crystallized without needing a high temperature, so that the fabricating process is easier to be implemented.

Second Embodiment

This embodiment provides a fabricating method of a thin film transistor similar to that of the first embodiment. This embodiment differs from the first embodiment in that steps 3 and 4 of the first embodiment are changed in this embodiment to the following steps of: forming a patterned oxide active layer film 4 by a patterning process on the substrate 1 successively formed with the inducing layer film 3 and the oxide active layer film 4 provided above the inducing layer film 3 and in contact therewith; and crystallizing the patterned oxide active layer film 4 through inducement of the inducing layer film 3 to form a crystalline oxide active layer 5.

Materials of the inducing layer film 3 and the oxide active layer film 4 are the same as those in the first embodiment, and the inducement method is also the same. In this embodiment, briefly, steps 3 and 4 in the first embodiment are reversed.

Third Embodiment

This embodiment provides a fabricating method of a thin film transistor similar to that of the first embodiment. This embodiment differs from the first embodiment in that step 2 of the first embodiment is changed in this embodiment to the following steps of: forming a gate insulating layer; successively depositing an oxide active layer film 4 and an inducing layer film 3 provided above the oxide active layer film 4 and in contact therewith; heating the substrate 1 subjected to the above step, and crystallizing the oxide active layer film 4 through inducement of the inducing layer film 3 to form a crystalline oxide active layer film; and forming a pattern including the oxide inducing layer 7 and the crystalline oxide active layer 5 by a patterning process.

In this embodiment, the oxide inducing layer 7 is disposed above the crystalline oxide active layer 5. For example, the pattern of the oxide inducing layer 7 and the pattern of the crystalline oxide active layer 5 may overlap with each other in a direction perpendicular to the substrate 1. Materials of the layers of the thin film transistor and fabricating methods of other film layers are the same as those in the first embodiment.

Fourth Embodiment

Figure 2A:
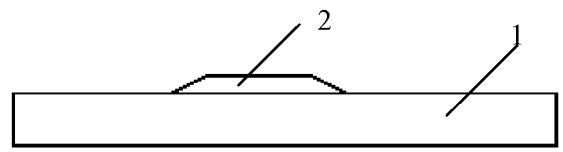
FIGS. 2A through 2E are flow charts of a fabricating method of a thin film transistor of a fourth embodiment of the present invention.
Figure 2B:
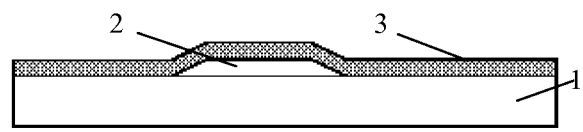
Figure 2C:
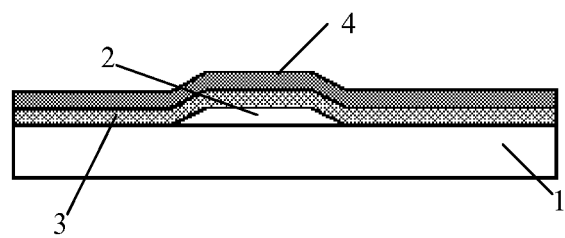

As shown in FIGS. 2A through 2E, this embodiment provides a fabricating method of a thin film transistor. Steps in the fabricating method as shown in FIGS. 2A through 2C are similar to those in the first through third embodiments, and a difference lies in that the fabricating method in this embodiment further comprises the following steps.

Figure 2D:
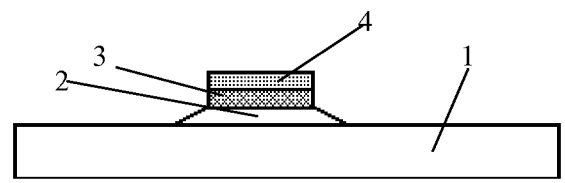

As shown in FIG. 2D, forming a patterned inducing layer film 3 and a patterned oxide active layer film 4 by a patterning process on the substrate 1 formed with the inducing layer film 3 and the oxide active layer film 4 provided above the inducing layer film 3 and in contact therewith.

Figure 2E:
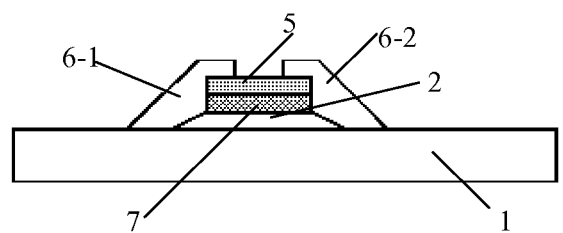

As shown in FIG. 2E, heating the substrate 1, so that the patterned oxide active layer film 4 is crystallized by inducement of the patterned inducing layer film 3 to form a crystalline oxide active layer 5, and the patterned inducing layer film 3 becomes an oxide inducing layer 7.

As shown in FIG. 2E, depositing a source-drain metal layer film on the substrate 1 subjected to the above step, and forming a pattern including a source 6-1 and a drain 6-2 of the thin film transistor by a patterning process, the source 6-1 and the drain 6-2 contacting the crystalline oxide active layer 5 via source and drain contact regions, respectively.

In the fabricating method, as shown in FIGS. 2A through 2E, the inducing layer film 3 and the oxide active layer film 4 are successively deposited on the substrate 1 formed with the gate 2, and the patterned inducing layer film 3 and the patterned oxide active layer film 4 are formed by a patterning process. Then the substrate 1 is heated to form the crystalline oxide active layer 5 and the oxide inducing layer 7. That is to say, the oxide inducing layer 7 is disposed below the crystalline oxide active layer 5. Since the oxide inducing layer 7 is insulative, there is no need of preparing a gate insulating layer in this case of a bottom-gate thin film transistor.

As a variant modification of the above fabricating method, an oxide active layer film 4 and an inducing layer film 3 may be successively deposited on a substrate 1 formed with a gate 2, a patterned inducing layer film 3 and a patterned oxide active layer film 4 are formed by a patterning process, then the substrate 1 is heated, so that the patterned oxide active layer film 4 is crystallized through inducement of the patterned inducing layer film 3 to form a crystalline oxide active layer 5, and the patterned inducing layer film 3 becomes an oxide inducing layer 7. That is to say, in this case the oxide inducing layer 7 is disposed above the crystalline oxide active layer 5. In the modification of the bottom-gate thin film transistor, fabrication of a gate insulating layer is also needed after formation of the gate 2, to electrically isolate the gate 2 from the crystalline oxide active layer 5.

In this embodiment, for example, the pattern of the oxide inducing layer 7 and the pattern of the crystalline oxide active layer 5 may overlap each other in a direction perpendicular to the substrate 1.

It needs to be noted that the first through fourth embodiments are only described by taking a fabricating method of a bottom-gate thin film transistor as an example, of course a top-gate thin film transistor may also be fabricated by using the above method. A main difference between fabricating the bottom-gate thin film transistor and fabricating the top-gate thin film transistor is the order of fabricating the crystalline oxide active layer 5 and the gate 2. It also needs to be noted that in fabrication of a top-gate thin film transistor, if the formed oxide inducing layer 7 is disposed above the crystalline oxide active layer 5, there is no need of fabricating a gate insulating layer between the crystalline oxide active layer 5 and the gate 2, as the oxide inducing layer 7 is used as the gate insulating layer. Other fabrication steps are similar to those of a bottom-gate thin film transistor, and are not described in detail herein.

Fifth Embodiment

This embodiment provides a thin film transistor fabricated by using any one of the methods of the first through fourth embodiments.

The thin film transistor in this embodiment may be top-gate type or bottom-gate type.

As the thin film transistor is fabricated by using any one of the methods of the first through fourth embodiments, the crystalline oxide active layer can be fabricated without needing a very high temperature in the process, so that the process is easier to be implemented.

Sixth Embodiment

This embodiment provides an array substrate comprising the thin film transistor described in the fifth embodiment.

The array substrate also comprises data lines, gate lines and other structures known to the person skilled in the art, which are not described in detail herein.

Seventh Embodiment

This embodiment provides a display device comprising the array substrate described in the sixth embodiment.

The display device may be applied to a mobile phone, a tablet computer, a television, a display, a notebook computer, a digital photo frame, a navigator, or any other product or component with a display function.

In addition, the display device of this embodiment may also comprise other conventional structures, such as a display driving unit, etc.

It should be understood that the above implementations are only exemplary implementations for illustrating the principle of the present invention, however, the present invention is not limited thereto. Various variations and improvements can be made by the person of ordinary skill in the art without departing from the spirit and essence of the present invention, and these variations and improvements should also be considered to be within the protection scope of the present invention.

The invention claimed is:

1. A fabricating method of a thin film transistor, comprising steps of:
   forming an inducing layer film and an oxide active layer film in contact therewith on a substrate, the oxide active layer film being provided above or below the inducing layer film; and
   heating the substrate subjected to the above step, crystallizing the oxide active layer film through inducement of the inducing layer film to form a crystalline oxide active layer,
   wherein the inducing layer film is made of metal having a hexagonal lattice structure or hexagonal lattice derived structure, and the step of forming the crystalline oxide active layer comprises:

putting the substrate formed with the inducing layer film and the oxide active layer film layer film becomes the crystalline oxide active layer film under action of the inducing layer film.

2. The fabricating method of a thin film transistor according to claim 1, wherein the step of forming the inducing layer film and the oxide active layer film in contact therewith on the substrate comprises:

forming the inducing layer film and the oxide active layer film successively on the substrate.

3. The fabricating method of a thin film transistor according to claim 2, wherein before forming the inducing layer film and the oxide active layer film successively on the substrate, the fabricating method further comprises:

forming a pattern including a gate by a patterning process on the substrate.

4. The fabricating method of a thin film transistor according to claim 1, wherein the step of forming the inducing layer film and the oxide active layer film in contact therewith on the substrate comprises:

forming the oxide active layer film and the inducing layer film successively on the substrate.

5. The fabricating method of a thin film transistor according to claim 1, wherein the metal having the hexagonal lattice structure or hexagonal lattice derived structure is any one of aluminum, magnesium and titanium.

6. The fabricating method of a thin film transistor according to claim 1, wherein a heating temperature ranges from 450° C. to 700° C. and the oxygen content of the oxygen-containing gas ranges from 5% to 40% in the step of forming the crystalline oxide active layer.

7. A display device, comprising an array substrate, the array substrate comprising thin film transistors fabricated by using the fabricating method of claim 1.

8. A fabricating method of a thin film transistor comprising steps of:

forming an inducing layer film and an oxide active layer film in contact therewith on a substrate, the oxide active layer film being provided above or below the inducing layer film; and heating the substrate subjected to the above step, crystallizing the oxide active layer film through inducement of the inducing layer film to form a crystalline oxide active layer, wherein the step of forming an inducing layer film and an oxide active layer film in contact therewith on a substrate comprises:

forming the inducing layer film and the oxide active layer film successively on the substrate, and wherein the step of crystallizing the oxide active layer film through inducement of the inducing layer film to form a crystalline oxide active layer comprises:

heating the substrate on which the inducing layer film and the oxide active layer film are successively formed, such that the oxide active layer film is crystallized through inducement of the inducing layer film to form a crystalline oxide active layer film, and the inducing layer film becomes an oxide inducing layer; and forming a pattern including the crystalline oxide active layer by a patterning process on the substrate subjected to the above step.

9. A fabricating method of a thin film transistor, comprising steps of:

forming an inducing layer film and an oxide active layer film in contact therewith on a substrate, the oxide active layer film being provided above or below the inducing layer film; and heating the substrate subjected to the above step, crystallizing the oxide active layer film through inducement of the inducing layer film to form a crystalline oxide active layer, wherein the step of forming an inducing layer film and an oxide active layer film in contact therewith on a substrate comprises:

forming the inducing layer film and the oxide active layer film successively on the substrate, and wherein the step of crystallizing the oxide active layer film through inducement of the inducing layer film to form a crystalline oxide active layer comprises:

forming a patterned oxide active layer film by a patterning process on the substrate on which the inducing layer film and the oxide active layer film are successively formed; and heating the substrate subjected to the above step, such that the patterned oxide active layer film is crystallized through inducement of the inducing layer film to form a crystalline oxide active layer, and the inducing layer film becomes an oxide inducing layer.

10. A fabricating method of a thin film transistor, comprising steps of:

forming an inducing layer film and an oxide active layer film in contact therewith on a substrate, the oxide active layer film being provided above or below the inducing layer film; and heating the substrate subjected to the above step, crystallizing the oxide active layer film through inducement of the inducing layer film to form a crystalline oxide active layer, wherein the step of forming an inducing layer film and an oxide active layer film in contact therewith on a substrate comprises:

forming the oxide active layer film and the inducing layer film successively on the substrate, and wherein the step of crystallizing the oxide active layer film through inducement of the inducing layer film to form a crystalline oxide active layer comprises:

heating the substrate on which the oxide active layer film and the inducing layer film are successively formed, such that the oxide active layer film is crystallized through inducement of the inducing layer film to form a crystalline oxide active layer film, and the inducing layer film becomes an oxide inducing layer film; and forming a pattern including the crystalline oxide active layer and the oxide inducing layer by a patterning process on the substrate subjected to the above step.

11. The fabricating method of a thin film transistor according to claim 10, wherein after forming the crystalline oxide active layer and the oxide inducing layer, the fabricating method further comprises:

forming a pattern including a gate by a patterning process.

12. A fabricating method of a thin film transistor, comprising steps of:

forming an inducing layer film and an oxide active layer film in contact therewith on a substrate, the oxide active layer film being provided above or below the inducing layer film, and forming a patterned inducing layer film and a patterned oxide active layer film by a patterning process; and heating the substrate subjected to the above step, crystallizing the patterned oxide active layer film through inducement of the patterned inducing layer film to form a crystalline oxide active layer, wherein the inducing layer film is made of metal having a hexagonal lattice structure or hexagonal lattice derived structure, and the step of forming the crystalline oxide active layer comprises:

putting the substrate formed with the patterned inducing layer film and the patterned oxide active layer film in an atmosphere of oxygen-containing gas and heating the substrate, such that the patterned oxide active layer film becomes the crystalline oxide active layer under action of the patterned inducing layer film, and the patterned inducing layer film becomes an oxide inducing layer.

13. The fabricating method of a thin film transistor according to claim 12, wherein the step of forming the patterned inducing layer film and the patterned oxide active layer film comprises:

forming the inducing layer film and the oxide active layer film successively on the substrate; and forming the patterned inducing layer film and the patterned oxide active layer film by a single patterning process on the substrate subjected to the above step.

14. The fabricating method of a thin film transistor according to claim 13, wherein before forming the inducing layer film on the substrate, the fabricating method further comprises:

forming a pattern including a gate by a patterning process on the substrate.

15. The fabricating method of a thin film transistor according to claim 12, wherein the step of forming the patterned inducing layer film and the patterned oxide active layer film comprises:

forming the oxide active layer film and the inducing layer film successively on the substrate; and forming the patterned inducing layer film and the patterned oxide active layer film by a single patterning process on the substrate subjected to the above step.

16. The fabricating method of a thin film transistor according to claim 15, wherein after forming the pattern of the crystalline oxide active layer, the fabricating method further comprises:

forming a pattern including a gate by a patterning process.

17. The fabricating method of a thin film transistor according to claim 12, wherein the metal having the hexagonal lattice structure or hexagonal lattice derived structure is any one of aluminum, magnesium and titanium.

18. The fabricating method of a thin film transistor according to claim 12, wherein a heating temperature ranges from 450° C. to 700° C. and the oxygen content of the oxygen-containing gas ranges from 5% to 40% in the step of forming the crystalline oxide active layer.

* * * * *